(12) United States Patent
Hatfield

(10) Patent No.: US 6,204,784 B1
(45) Date of Patent: Mar. 20, 2001

(54) MULTIPLE ANALOG TO DIGITAL CONVERTER CLOCK PHASE ALIGNMENT TECHNIQUE USING VARACTOR DIODES

(75) Inventor: Roy G. Hatfield, Downey, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/553,648

(22) Filed: Apr. 21, 2000

(51) Int. Cl.[7] ...................................... H03M 1/06
(52) U.S. Cl. .......................... 341/118; 341/131; 341/122
(58) Field of Search .................... 341/155, 156, 341/160, 161, 118, 119, 131, 111, 122, 115, 141; 327/256, 295, 513, 558

(56) References Cited

U.S. PATENT DOCUMENTS 5,488,369 * 1/1996 Miller ..................................... 341/122
5,563,596 * 10/1996 Snyder et al. ........................ 341/131

OTHER PUBLICATIONS

Data Sheet for Analog Devices A/D Converter AD9070 (16 Pages).

* cited by examiner

*Primary Examiner*—Brian Young
*Assistant Examiner*—John Nguyen
(74) *Attorney, Agent, or Firm*—Leonard A. Alkov; Glenn H. Lenzen, Jr.

(57) ABSTRACT

An analog to digital converter system with clock timing compensation includes an analog to digital converter circuit having an input terminal for receiving an analog signal to be sampled and converted to a digital value, one or more output terminals providing one or more logical output signals, and a clock terminal for receiving a sampling clock signal for clocking the sampling of the input signal. A thermally compensated clock circuit is responsive to a clock signal for providing the sampling clock signal, and includes a low pass filter circuit comprising a resistor element and a varactor diode, and a varactor bias network for providing a thermally compensated varactor bias voltage to the varactor diode. The clock timing circuit with varactor diodes can be used to provide very fine resolution adjustments to the individual clock circuits in a multiple analog to digital converter circuit system. The thermally compensated varactor bias networks allow the clock timing to stay within specification over a wide temperature range.

18 Claims, 2 Drawing Sheets

MULTIPLE ANALOG TO DIGITAL CONVERTER CLOCK PHASE ALIGNMENT TECHNIQUE USING VARACTOR DIODES

This invention was made with Government support under Contract No. DAAB07-97-C-D614 awarded by the Department of the Army. The Government has certain rights in this invention.

TECHNICAL FIELD OF THE INVENTION

This invention relates to analog to digital converter circuits, and more particularly to techniques for ensuring accurate clock timing over wide temperature ranges.

BACKGROUND OF THE INVENTION

The timing alignment of the sampling clock that is used by each analog to digital converter is important for good image rejection of the interleaved output of multiple analog to digital converters. Clock phase alignment has typically been accomplished using fixed low value capacitors, solder pad jumper matrices on printed wiring boards, matched length cabling, fixed element passive delay lines, or active integrated circuits (programmable delay lines). These techniques suffer from one of the following disadvantages: lack of a means for temperature compensation or of a simple adjustment of the delay value, degradation of the clock phase jitter value, or insufficient adjustment resolution.

It would therefore be an advantage to provide a technique for improved clock alignment resolution.

SUMMARY OF THE INVENTION

In accordance with one aspect of the invention, an analog to digital converter system with clock timing compensation is described. The system includes an analog to digital converter circuit having an input terminal for receiving an analog signal to be sampled and converted to a digital value, one or more output terminals providing one or more logical output signals, and a clock terminal for receiving a sampling clock signal for clocking the sampling of the input signal. A thermally compensated clock circuit is responsive to a clock signal for providing the sampling clock signal, and includes a low pass filter circuit comprising a resistor element and a varactor diode, and a varactor bias network for providing a thermally compensated varactor bias voltage to the varactor diode.

According to another aspect of the invention, varactor diodes are used in a low pass filter configuration to provide very fine resolution adjustments to the individual clock circuits in a multiple analog to digital converter circuit system. A thermally compensated varactor bias network allows the clock timing to stay within specification over a wide temperature range.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENTS

Figure 1:
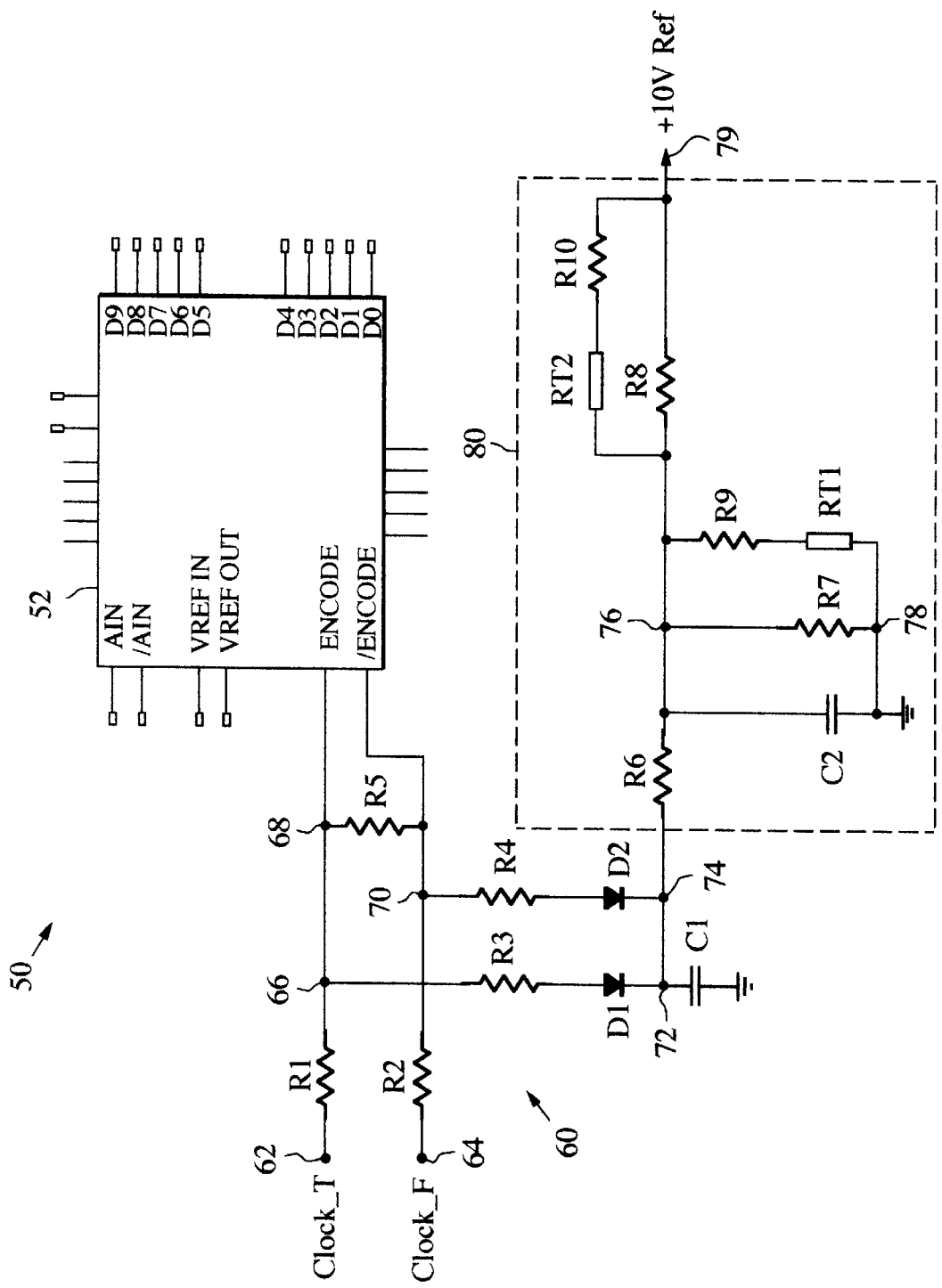
FIG. 1 is a schematic diagram of a clock timing circuit for an analog to digital converter in accordance with the invention.

FIG. 1 illustrates a circuit technique in accordance with an aspect of this invention for providing timing alignment of the clock phase for an analog to digital converter (ADC) circuit. Device 52 is an ADC device, in this exemplary embodiment a commercially available device such as the Analog Devices AD9070 ADC, providing 10 bit resolution at 100 MHz with a nominal clock rate of 87.5 MHz. The device 52 has analog input terminals AIN and /AIN, for receiving the analog inputs to the device 52. The input signals at these two inputs differ from each other only in that they are 180° out of phase. The AIN terminal is typically considered the in-phase input terminal for receiving the in-phase version of the input signal, and the /AIN terminal the input terminal for the receiving the out-of-phase version of the input signal. In-phase and out-of-phase signals are commonly used in analog-to-digital conversion techniques to improve common mode noise rejection at the sensitive inputs of the analog-to-digital converter circuit. For this exemplary embodiment, the typical AIN and /AIN input frequencies of the circuit are in the range of 5 MHz to over 80 MHz, although this range will differ for each application.

A ten-bit digitized output for the device 52 representative of the amplitude of the input signal is represent by the logic levels on outputs D0–D9.

A differential clock circuit 60 provides sampling clock signals at ENCODE and /ENCODE device terminals for the ADC device 52. The ENCODE terminal receives the in-phase version of the clock signal, and the /ENCODE terminal receives the out-of-phase (180°) version of the sampling clock signal. In this exemplary embodiment, the clock signal frequency is fixed at 87.5 MHz, although the clock frequency will of course be dependent on the application.

An adjustable low pass filter provides a timing alignment delay in accordance with an aspect of the invention on the differential clock circuit. In this embodiment, the clock circuit responds to clock signals CLOCK_T and CLOCK_ at terminals 62 and 64, respectively. Resistors R1/R2 and varactor diodes D1/D2 comprise the adjustable low pass filters that provides the alignment time delay. Thus, resistor R1 and diode D1 are connected in series between terminal 62 and node 72 to provide a first low pass filter, with the ENCODE device terminal connected at node 66. Similarly, resistor R2 and diode D2 are connected in series between terminal 64 and node 74 to provide a second low pass filter, with the /ENCODE device terminal connected at node 70.

The varactor diodes D1 and D2 have the well known characteristic of a voltage-dependent junction capacitance, wherein the capacitance decreases with the reverse-bias voltage.

Respective resistors R3/R4 are connected in series with resistors R1/R2, and are used to decrease the sensitivity of the varactor bias adjustment, in case the varactor diodes selected for a particular circuit have a larger than needed capacitance range. The resistors R3/R4 are not necessary in some applications; if the capacitance value of the varactor diodes (discussed below) is not too high for the amount of time delay range desired, then these resistances can be set to zero ohms.

Resistor R5 is connected between device terminals ENCODE and /ENCODE, and is the differential clock termination resistor for ADC device 52. For some ADC devices, this resistor is employed to properly terminate the ENCODE and /ENCODE differential clock signals. The clock signal rise and fall times are important for good performance of the ADC circuits. The value of R5 is set to match the line impedance of the differential clock signal, e.g. for an exemplary application, 50 ohms. For this exemplary line impedance value, the value of R5 can be set to 100 ohms.

Capacitor C1 is connected between connected nodes 72, 74 and ground, and serves two purposes. The first is to provide an RF path to ground for the clock signal present at diodes D1 and D2. The second purpose is provide one of two filter stages for the varactor bias voltage provided at resistor R6.

A varactor diode bias network 80 is connected to common nodes 72 and 74, to provide a bias voltage for the varactor diodes D1, D2. A first bias voltage filter stage is formed by resistor R8 and capacitor C2, with resistor R8 connected between node 76 and a reference voltage at node 79, +10 V in this exemplary embodiment. Capacitor C2 is connected between node 76 and ground.

The varactor diode bias voltage should be very clean from extraneous noise that may appear on the +10 V reference voltage. Noise on the varactor diode bias would cause the varactor diodes to introduce timing jitter of the clock signal and therefore degrade the ADC performance. The first bias filter stage formed by R8 and C2 is a simple low pass filter. The characteristics of the low pass filter can be changed to match the requirements of the particular application.

The bias network 80 further includes resistor R7, which with R8 sets the room temperature voltage value. R7 and R8 form a voltage divider network. The +10 V reference voltage applied to network 80 is changed to a lower voltage needed by the varactor diodes by the amount set by the relationship of the R7 and R8 resistance values. For example, if R7 and R8 were both 1000 ohms, then the voltage that would appear at node 74 would be half the +10 V reference voltage. The particular values of R7 and R8 are selected to set the time delay of the ADC clock signal at room temperature.

The bias network 80 further includes resistors R9 and R10 and thermistors RT1 and RT2 used as necessary to provide temperature compensation. Thermistor RT1 is connected in series with resistor R9 between node 76 and ground. Thermistor RT2 is connected in series with resistor R10 between node 76 and the +10 V reference voltage. The clock delay value is proportional to the varactor bias voltage provided by network 80. The varactor bias voltage is compensated for temperature variations by R9, R10, RT1 and RT2. For some applications, one or more of R9, R10, RT1 and RT2 can be set to zero ohms, in order to achieve proper temperature compensation.

Exemplary element values and devices for the circuit elements of FIG. 1 for one application are set out below, although these parameters will vary according to the requirements of a particular application.

R1, R2=51.1 ohms
R3, R4=0 ohms
R6=10000 ohms
R7=6980 ohms
R8=6040 ohms
R9=4300ohms
R10, RT2=not installed
RT1=U.S. Sensor Corp. part number 502FG1K
C1, C2=0.1 microfarad
D1, D2=Philips Semiconductor part number BB405B The circuit of FIG. 1 employs a resistor/capacitor low pass filter, with the capacitor replaced by a varactor diode, and allows for a very high degree of clock alignment resolution. The use of varactor diodes in a low pass filter configuration does not add to the phase jitter of the clock signal. Other techniques using programmable active components would have an adverse effect on the clock phase jitter. The varactor diode bias network is easily adjusted with a thermistor to provide temperature compensation of the clock timing adjustment alignment.

The circuit technique illustrated in FIG. 1 can be employed as a means of aligning the clock signal for multiple analog to digital converters, to allow use of lower sampling speed analog to digital converters operating in parallel to appear as a single analog to digital converter operating at a higher sampling rate. For some applications, for example, the clock alignment needs an adjustment resolution of 1 picosecond or less. In addition to the fine adjustment resolution, the alignment circuit cannot be allowed to degrade the clock phase jitter parameter.

This invention is particularly useful for systems which employ multiple analog to digital converters in parallel, commonly referred to as "ping pong" ADC circuits. An advantage is that lower cost analog to digital converters can be used to duplicate the performance of a single high speed analog to digital converter. Another advantage of the invention is that the sampling rate performance of high resolution analog to digital converter circuits can be increased beyond the available single par solutions for the equivalent resolution. All wideband RF applications using analog to digital converters could benefit from the invention.

Figure 2:
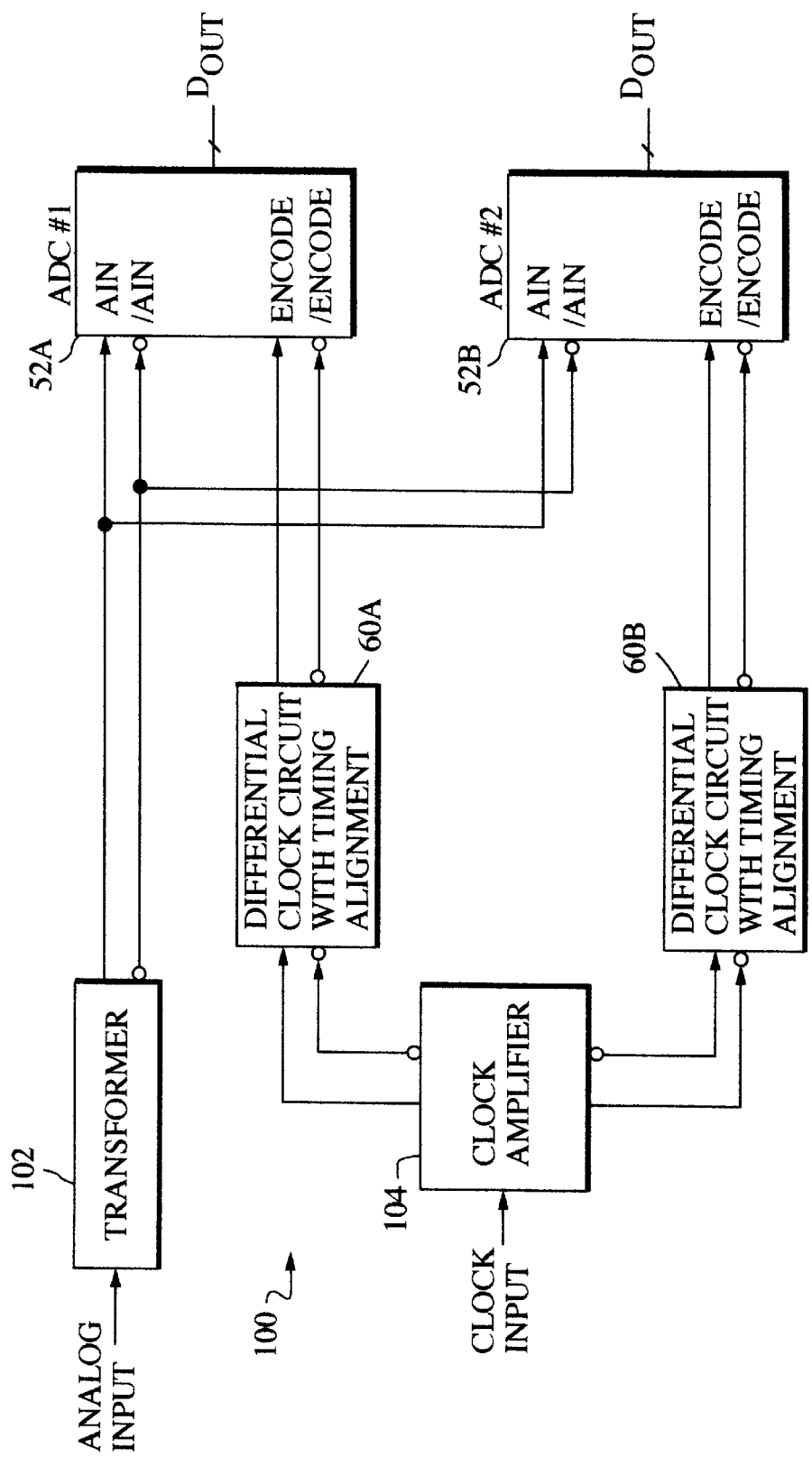
FIG. 2 is a schematic block diagram of multiple analog to digital converters connected in parallel as a ping pong ADC circuit, and wherein clock timing circuits are used in accordance with the invention for each analog to digital converter.

FIG. 2 shows an exemplary ping-pong ADC circuit 100 employing the present invention. The analog input is passed through a transformer 102 in this exemplary embodiment to transform a single-ended analog input signal into differential signals which are 180° out-of-phase for the ADC devices 52A, 52B. A clock amplifier circuit 104 is responsive to the sampling clock input to provide differential clock signals which are 180° out of phase for the timing alignment circuits 60A, 60B. As illustrated in FIG. 2, the differential clock signals are connected to the first timing alignment circuit 60A in the same phase sense as for the circuit of FIG. 1, i.e. with the in-phase and out-of-phase clock signals connected to the respective ENCODE and /ENCODE terminals of ADC device 52A. However, the differential clock signals are connected to the second timing alignment circuit 60B in the reverse order, i.e. the in-phase and out-of-phase clock signals are connected to the respective /ENCODE and ENCODE terminals of the ADC 52B.

In this way, the two ADC devices 52A, 52B are sampling the analog input signal on opposite edges of the ENCODE clock signal. For example, the first ADC device 52A will sample the analog input signal on the rising edge of the clock signal and the second ADC device 52B will sample the analog input signal on the falling edge of the clock signal. In order for the circuit 100 to have high performance, the two ADC devices 52A, 52B need to be precisely 180° out of phase. THe precise control of this timing relationship is provided by the timing alignment circuits 60A, 60B in accordance with an aspect of the invention. Each of the circuits 60A, 60B is as described above with respect to circuit 60 of FIG. 1, and each includes a varactor bias network as discussed above to provide the timing compensation.

It is understood that the above-described embodiments are merely illustrative of the possible specific embodiments which may represent principles of the present invention. Other arrangements may readily be devised in accordance with these principles by those skilled in the art without departing from the scope and spirit of the invention. For example, while the illustrative embodiments shown in FIGS. 1 and 2 have employed differential input and clock signals, the invention can be employed with single-ended analog signals and single-ended clock signals.

What is claimed is:

1. An analog to digital converter system with clock timing compensation, comprising:

an analog to digital converter circuit having an input terminal for receiving an analog signal to be sampled and converted to a digital value, one or more output terminals providing one or more logical output signals, and a clock terminal for receiving a sampling clock signal for clocking the sampling of the input signal; and a thermally compensated clock circuit responsive to a clock signal for providing the sampling clock signal, said clock circuit including a low pass filter circuit comprising a resistor element and a varactor diode, and a varactor bias network for providing a thermally compensated varactor bias voltage to the varactor diode.

2. The converter system of claim 1 wherein the low pass filter circuit comprises a series connection of the resistor element and the varactor diode between a clock signal input terminal and a connection node.

3. The converter system of claim 2 further comprising a capacitor connected between the connection node and electrical ground.

4. The converter system of claim 1 wherein the bias network includes a thermistor to provide said temperature compensation.

5. The converter system of claim 1 wherein the bias network includes a first bias voltage filter stage and a second bias voltage filter stage connected to a reference voltage.

6. The converter system of claim 5 wherein the first bias voltage filter stage includes a first filter resistor element and a first filter capacitor.

7. The converter system of claim 6 wherein the second bias voltage filter stage includes a second filter capacitor connected between said connection node and ground.

8. The converter system of claim 1 wherein the thermally compensated clock circuit provides a timing delay to the clock signal to provide the sampling clock signal, and wherein the timing delay is proportional to the varactor bias voltage.

9. In a ping-pong analog-to-digital converter (ADC) circuit employing multiple ADC circuits, and wherein a first ADC circuit is clocked by a first phase of a sampling clock, and a second ADC circuit is clocked by the second phase of the sampling clock 180° out-of-phase with the first phase, a thermally compensated clock timing delay circuit comprising:

a first low pass filter circuit coupled to the first phase of the clock signal, the first low pass filter circuit including a first resistor element and a varactor diode;

a second low pass filter circuit coupled to the second phase of the clock signal, the second low pass filter circuit including a first resistor element and a varactor diode;

a varactor bias network for providing a thermally compensated varactor bias voltage to the first and second varactor diodes, and wherein the clock timing delay circuit provides a timing delay proportional to the varactor bias voltage.

10. The circuit of claim 9 wherein the first low pass filter circuit comprises a series connection of the first resistor element and the first varactor diode.

11. The circuit of claim 10 wherein the second low pass filter circuit comprises a series connection of the second resistor element and the second varactor diode.

12. The circuit of claim 9 wherein the bias network includes a thermistor to provide said temperature compensation.

13. The circuit of claim 9 wherein the bias network includes a first bias voltage filter stage and a second bias voltage filter stage connected to a reference voltage.

14. An analog-to-digital converter (ADC) system, comprising:

an analog to digital converter circuit having respective differential input signal terminals for receiving differential analog input signals to be sampled and converted to digital values, differential output terminals providing digital differential output signals, and differential clock terminals for receiving in-phase and output-of-phase sampling clock signals for clocking the sampling of the input signal; and a thermally compensated clock timing delay circuit comprising:

a first low pass filter circuit coupled to the first phase of the clock signal, the first low pass filter circuit including a first resistor element and a varactor diode;

a second low pass filter circuit coupled to the second phase of the clock signal, the second low pass filter circuit including a first resistor element and a varactor diode;

a varactor bias network for providing a thermally compensated varactor bias voltage to the first and second varactor diodes, and wherein the clock timing delay circuit provides a timing delay proportional to the varactor bias voltage.

15. The system of claim 14 wherein the first low pass filter circuit comprises a series connection of the first resistor element and the first varactor diode.

16. The system of claim 15 wherein the second low pass filter circuit comprises a series connection of the second resistor element and the second varactor diode.

17. The system of claim 14 wherein the bias network includes a thermistor to provide said temperature compensation.

18. The system of claim 14 wherein the bias network includes a first bias voltage filter stage and a second bias voltage filter stage connected to a reference voltage.

* * * * *